United States Patent
Ikemizu et al.

[11] Patent Number: 5,892,277
[45] Date of Patent: Apr. 6, 1999

[54] TAB TAPE AND SEMICONDUCTOR DEVICE USING THE TAB TAPE

[75] Inventors: Morihiko Ikemizu, Yokohama; Takayuki Okutomo, Kitakami; Yutaka Fukuoka, Hiratsuka; Masafumi Takeuchi, Tokyo, all of Japan

[73] Assignee: Kabushiki Kaisha Toshiba, Kawasaki, Japan

[21] Appl. No.: 879,304

[22] Filed: Jun. 19, 1997

[30] Foreign Application Priority Data

Jun. 20, 1996 [JP] Japan .................... 8-159686

[51] Int. Cl.$^6$ .................................................... H01L 23/48
[52] U.S. Cl. ................................ 257/700; 257/752
[58] Field of Search ............................ 257/702, 752, 257/778, 779, 700

[56] References Cited

U.S. PATENT DOCUMENTS 4,916,514  4/1990  Nowak ........................ 257/752

*Primary Examiner*—Peter Toby Brown
*Assistant Examiner*—Roy Potter
*Attorney, Agent, or Firm*—Finnegan, Henderson, Farabow, Garrett & Dunner, L.L.P.

[57] ABSTRACT

In a TAB tape, dummy copper foil patterns are provided on the portions of an adhesive on which neither pads nor leads are provided, thereby flattening the upper surface of solder resist coated on the resultant structure.

11 Claims, 4 Drawing Sheets

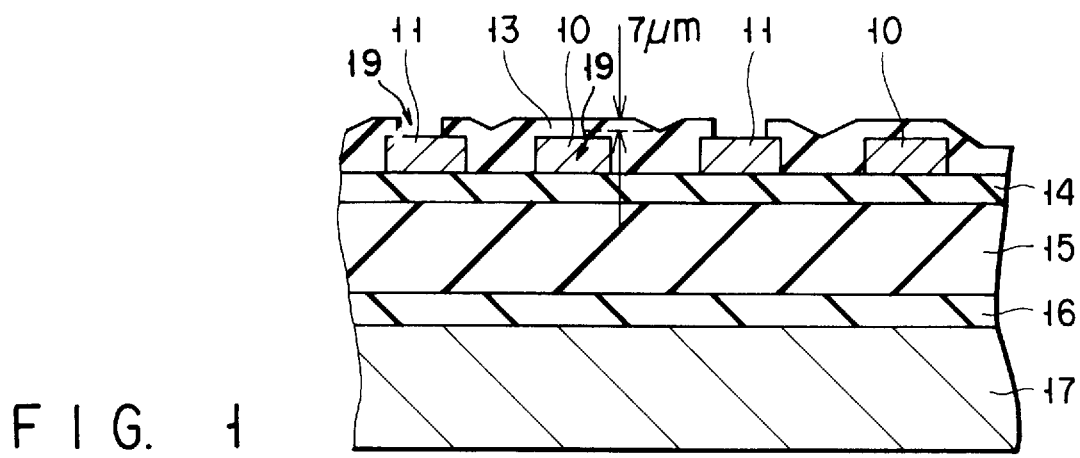
F I G. 1
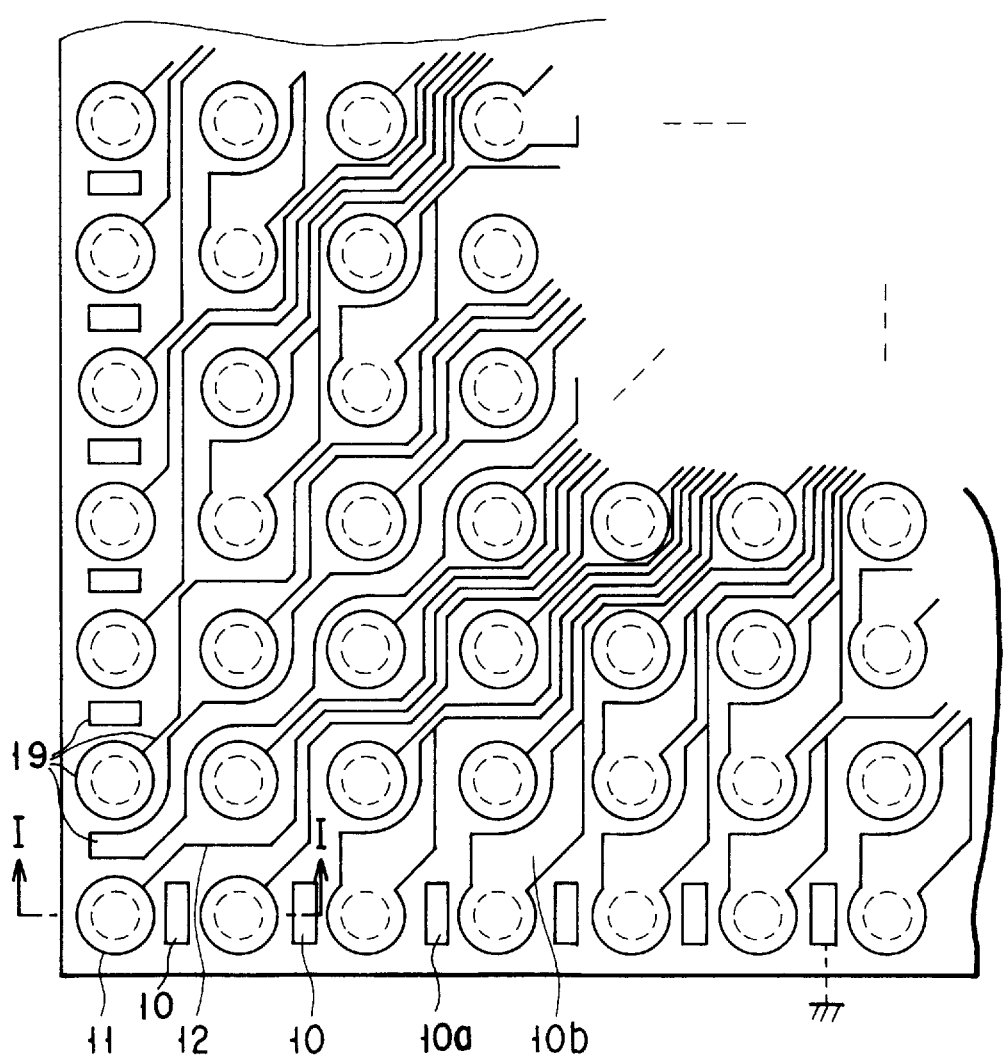
F I G. 2

TAB TAPE AND SEMICONDUCTOR DEVICE USING THE TAB TAPE

BACKGROUND OF THE INVENTION

This invention relates to a TAB tape and a semiconductor device using the TAB tape, and more particularly to a TAB tape used as a tape-type Ball Grid Array (BGA).

FIG. 3 is a plan view, showing a conventional TAB tape of a three-layer structure. FIG. 4 is a cross sectional view, showing the TAB tape of FIG. 3. The TAB tape shown in FIGS. 3 and 4 comprises a resin tape 35 made of polyimide, an adhesive 34 coated on the resin tape, and copper foil patterns 31 and 32 formed on the adhesive. The copper foil patterns 31 and 32 consist of pads 31a to which solder balls are adhered, and leads 32a for connecting the pads 31a to a semiconductor chip (not shown). The copper foil patterns 31 and 32, the exposed portions of the adhesive 34 are coated with solder resist 33 which protects them. A hole is formed in the portion of the solder resist 33 which is located on each pad 31a. Supposing that each copper foil pattern has a film thickness of 18 μm, the difference in level is also 18 μm between the upper surface of each of the portions of the solder resist 35 which are coated on the copper foil patterns 31 and 32, and the upper surface of each of the portions of the solder resist 33 which are coated on the exposed portions of the adhesive 34.

FIG. 5 shows a stiffener, to which the polyimide tape 35 of the TAB tape is adhered. This stiffener is for a BGA tape, and comprises a metal plate 52 and an adhesive 51 coated thereon.

FIG. 6 is a view, useful in explaining a process for adhering the TAB tape shown in FIG. 4 to the stiffener shown in FIG. 5 by thermo-compression bonding. In FIG. 6, elements similar to those shown in FIGS. 4 and 5 are denoted by corresponding reference numerals, and no explanation is given thereof. As is shown in FIG. 6, the TAB tape and the stiffener are held between tools 61 and 62. In this state, pressure is applied to the TAB tape and the stiffener from the outside of both the tools 61 and 62, while heat is applied thereto. As a result, the tape and the stiffener are adhered to each other by means of the adhesive 51.

Thereafter, as shown in FIG. 7A, the resultant TAB tape 74 is adhered to a semiconductor chip 72, the chip 72 is sealed with a potting resin 71, and solder balls 75 are attached to the pads of the TAB tape 74, thereby forming a semiconductor device. FIG. 7B is a plan view of the semiconductor device shown in FIG. 7A.

In the FIG. 6 process for adhering the TAB tape to the stiffener by thermo-compression, the solder resist 33 has great irregularities as described above, and therefore the pressure from the upper and lower tools 61 and 62 does not reach the deep concave portions 63 of the solder resist. Accordingly, the adhesive 51 is not sufficiently pressed at locations below the concave portions 63, and hence may well have an insufficiently adhered portion 81 as shown in FIG. 8.

Thereafter, when the adhesive 51 is heated in a cure or reflow process, a bubble will occur at the insufficiently adhered portion. FIG. 9 is a sectional view, showing the state of the BGA tape in which a bubble 91 occurs therein. As is understood from FIG. 9, the BGA tape is warped due to the bubble 91, thereby degrading the flatness of the package, and it is difficult to make the lights the solder balls equal.

BRIEF SUMMARY OF THE INVENTION

It is the object of the invention to securely adhere the TAB tape to the overall surface of a stiffener, thereby enhancing the flatness of a package.

To attain the object, the invention comprises a resin tape, pads formed on the resin tape, copper foil patterns constituting leads, dummy copper foil patterns provided between the copper foil patterns, and solder resist coated on the overall surfaces of the copper foil patterns and the dummy copper foil patterns.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view, showing the embodiment of the invention;

FIG. 2 is a plan view of the embodiment of FIG. 1;

DETAILED DESCRIPTION OF THE INVENTION

Figure 3:
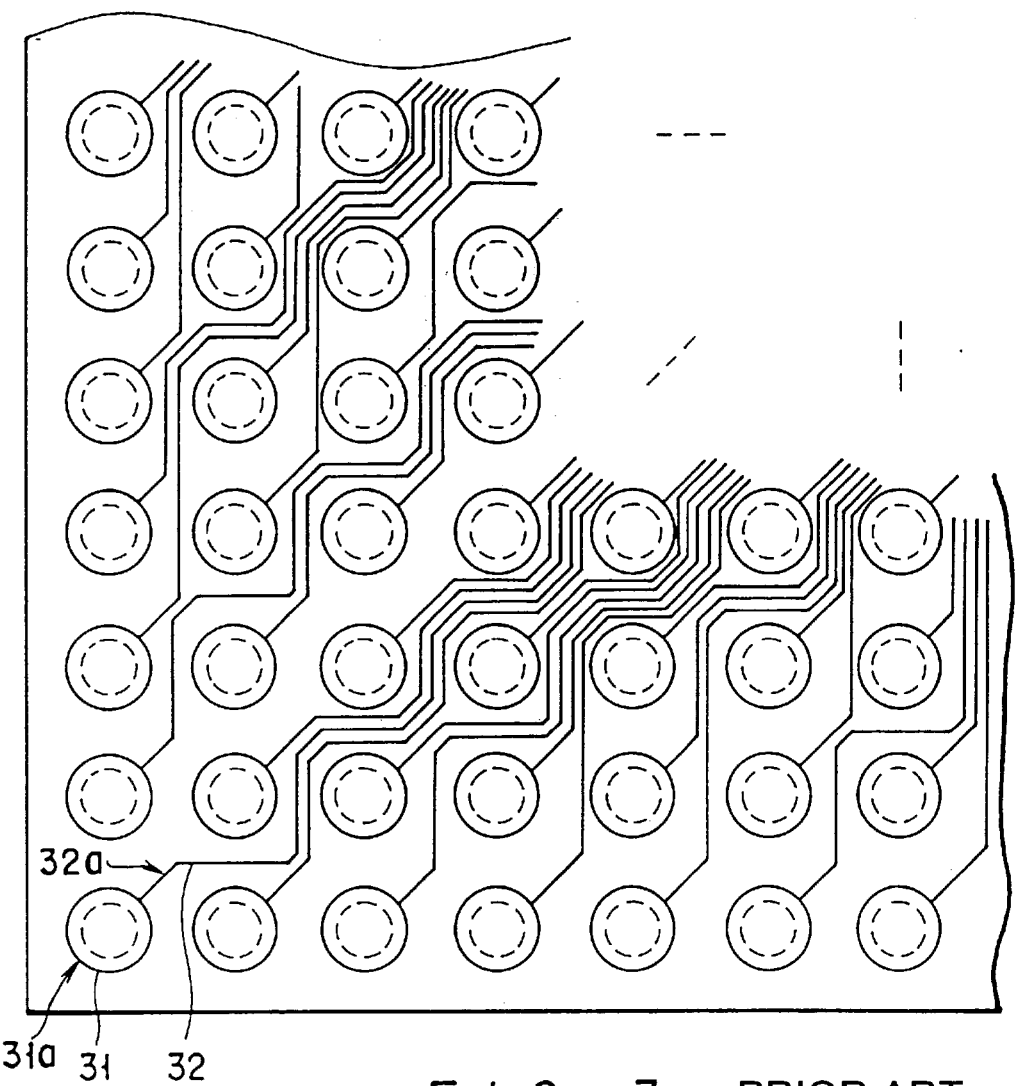
FIG. 3 is a plan view, showing a conventional TAB tape.
Figure 4:
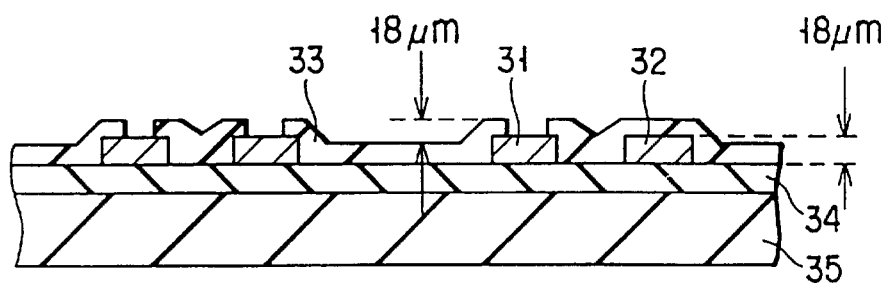
FIG. 4 is a sectional view of the TAB tape shown in FIG. 3.
Figure 5:
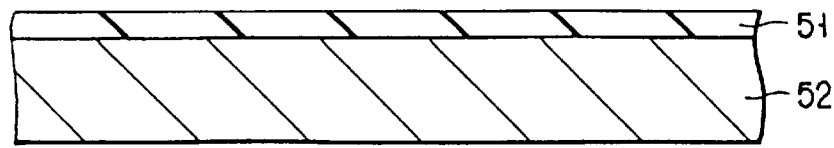
FIG. 5 is a view, showing a stiffener for use in a BGA tape.
Figure 6:
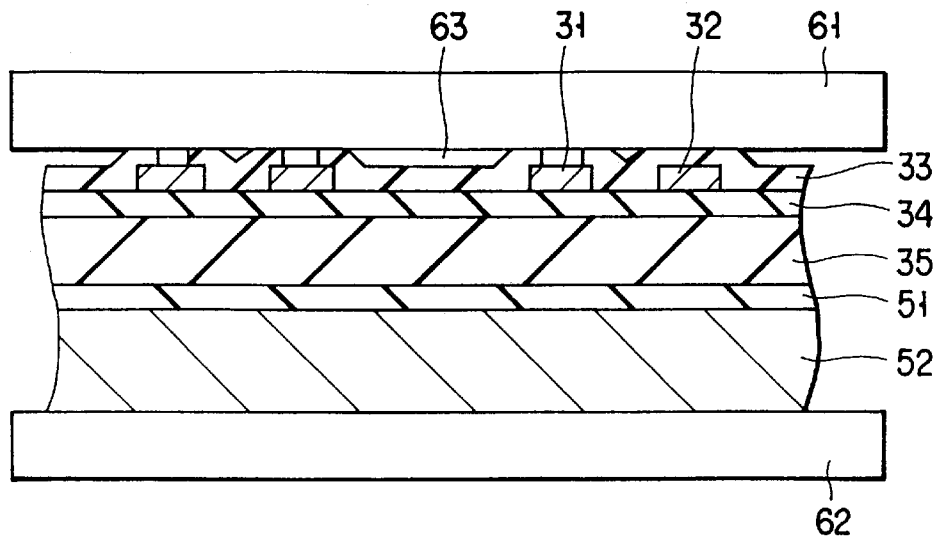
FIG. 6 is a view, useful in explaining a process for adhering a TAB tape to a stiffener by thermo-compression.
Figure 7A:
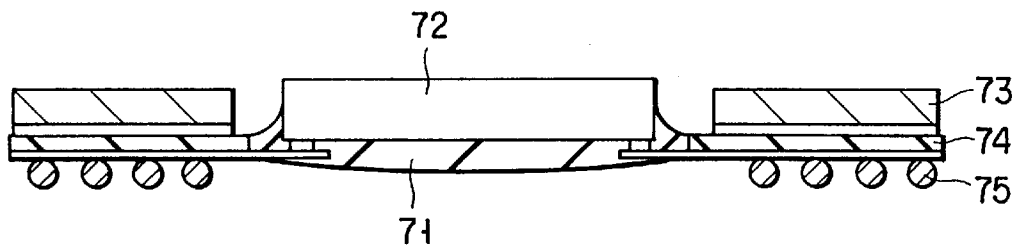
FIG. 7A is a sectional view, showing a semiconductor device.
Figure 7B:
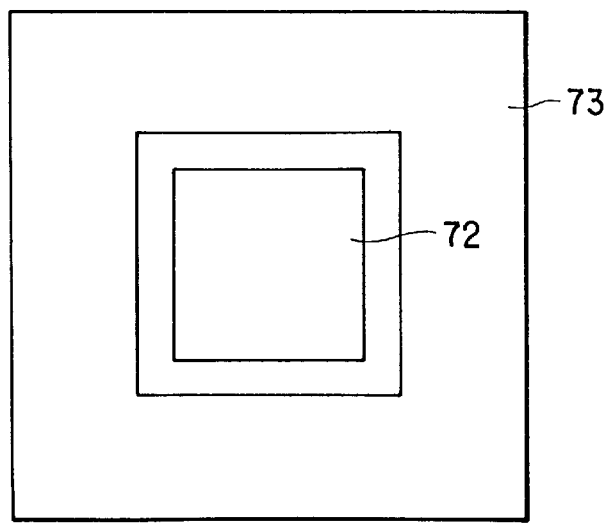
FIG. 7B is a plan view of the semiconductor device shown in FIG. 7A.
Figure 8:
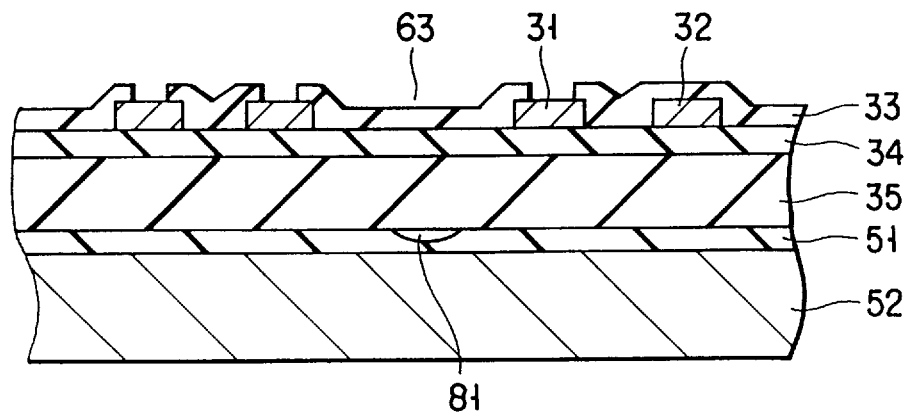
FIG. 8 is a sectional view, showing a conventional BGA tap obtained after a thermo-compression adhesion treatment.
Figure 9:
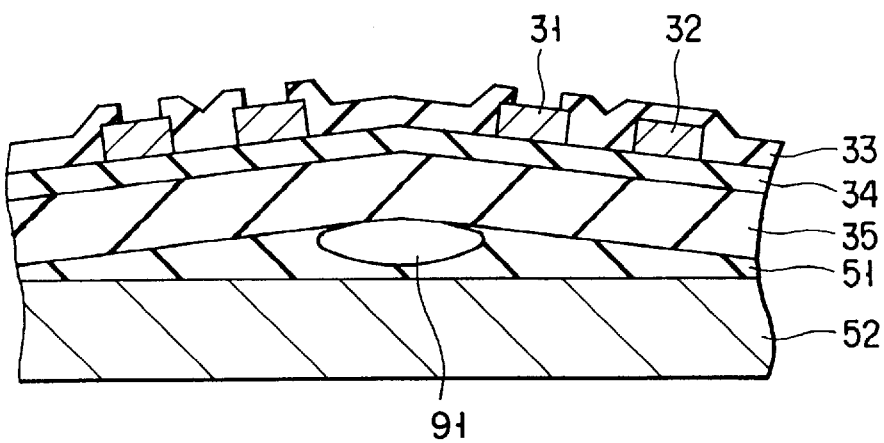
FIG. 9 is a sectional view, showing a conventional BGA tap obtained after heat treatment.

The embodiment of the invention will be described with reference to the accompanying drawings.

FIG. 1 is a sectional view, showing a BGA tape according to the embodiment of the invention. FIG. 2 is a plan view of the embodiment of FIG. 1. The sectional view of FIG. 1 is taken along lines I—I of FIG. 2.

In the BGA tape of the embodiment, an adhesive 14 is coated on one surface of a resin tape 15 made, for example, of polyimide. Metallic patterns, for example, copper foil patterns 19 are formed on the adhesive 14. The copper foil patterns 19 consists of pads 11 to which solder balls are attached, and leads 12 for connecting the pads 11 to a semiconductor chip. Each lead 12 has a width of e.g. 30–60 μm.

The adhesive 14 is provided with dummy metallic patterns 10, 10a, 10b such as copper foil patterns 19. The dummy metallic pattern means a pattern electrically connected between the pad 11 and the lead 12, and having a width greater than the lead 12, or a pattern electrically connected neither to the pad 11 nor to the lead 12. The width of the pattern is, for example, 600–800 μm at maximum.

The copper foil patterns 10–12 are coated with solder resist 13. The opposite side of the polyimide tape 15 is adhered to a metal plate 17 by means of an adhesive 16. The metal plate 17 and the adhesive 16 are constitute a stiffener.

As is shown in FIGS. 1 and 2, each of dummy patterns 10, 10a, 10b is formed in a wide space defined between adjacent ones of the pads 11 or of the leads 12, or between each pad 11 and a corresponding lead 12. In general, the dummy patterns 10 are formed simultaneous. with the pads 11 and the lead 12. The dummy pattern may be formed independent of the other elements as dummy patterns 10, 10a, or connected to the pad 11 as a dummy pattern 10b, or grounded.

In the embodiment, the areas of the portions of the adhesive 14 which are exposed in a stage before the coating of the solder resist 13 are minimized by providing the dummy patterns 10, 10a, 10b on the adhesive 14. Since the solder resist 13 is applied in this stage, the difference in level is minimized between the upper surface of each of the portions of the solder resist 13 which are coated on the copper foil patterns 19, and the upper surface of each of the portions of the solder resist 13 which are coated on the exposed portions of the adhesive 14. If the film thickness of the copper foil patterns 19 is 18 $\mu$m, the difference in level can be reduced to 3–18 $\mu$m, more particularly to 7 $\mu$m or less.

Accordingly, at the time of adhering the stiffener to the TAB tape, a uniform pressure can be applied to the overall adhesive, with the result that no insufficiently adhered portions will be formed between the adhesive 16 and the TAB tape 15, and hence no bubbles will occur therebetween. Thus, the adhesion between the adhesive 16 and the TAB tape 15 will be enhanced.

Moreover, since the contact area between the adhesive 14 and the copper foil patterns is increased by connecting dummy patterns to leads and pads, the strength of adhesion between the TAB tape 15 and the copper foil is increased.

In addition, grounding the dummy patterns formed between the pads will reduce the inductance between each pair of adjacent pads.

Although in the above-described embodiment, the TAB tape has a three-layer structure, the invention is not limited to this. The TAB tape may have a double layer structure consisting of a resin tape and a copper foil pattern layer. Also, the patterns and the dummy patterns are not limited to copper foil patterns.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A semiconductor device comprising:

a resin tape;

metallic patterns, including pads and leads, formed on the resin tape;

solder resist coated on the metallic patterns and on exposed portions of the resin tape between the metallic patterns; and dummy metallic patterns provided in spaces defined between adjacent ones of the metallic patterns and coated with the solder resist, said dummy metallic patterns reducing level differences between upper surfaces of the solder resist, wherein each of the dummy metallic patterns has a width greater than each of the leads.

2. The semiconductor device according to claim 1, wherein the sum of the thickness of each metallic pattern and the thickness of the portion of the solder resist which is provided on said each metallic pattern is greater, by an amount of from 3 $\mu$m to less than 8 $\mu$m, than the sum of the thickness of each dummy metallic pattern between corresponding adjacent ones of the metallic patterns and the thickness of the portion of the solder resist which is provided on said each dummy pattern.

3. The semiconductor device according to claim 1, wherein each dummy metallic pattern is connected to a corresponding one of the pads and a corresponding one of the leads.

4. The semiconductor device according to claim 1, wherein the dummy metallic patterns are grounded.

5. The semiconductor device according to claim 1, wherein an adhesive is coated between the resin tape and the metallic patterns and between the resin tape and the dummy metallic patterns.

6. The semiconductor device according to claim 1, wherein the dummy metallic patterns provided between the pads are not connected to the pads or to the leads.

7. A semiconductor device comprising:

a resin tape;

metallic patterns, including pads and leads, formed on the resin tape;

solder resist coated on the metallic patterns and on exposed portions of the resin tape between the metallic patterns; and dummy metallic patterns provided in spaces defined between adjacent ones of the pads and the leads and coated with the solder resist, said dummy metallic patterns connected to corresponding ones of the pads and corresponding ones of the leads.

8. The semiconductor device according to claim 7, wherein each of said dummy metallic patterns has a width greater than each of the leads.

9. The semiconductor device according to claim 7, further comprising:

a stiffener adhered to a lower surface of said resin tape; and an adhesive provided between said resin tape and said stiffener, said adhesive having no bubbles.

10. A semiconductor device comprising:

a resin tape;

metallic patterns, including pads and leads, formed on the resin tape;

solder resist coated on the metallic patterns and on exposed portions of the resin tape between the metallic patterns; and dummy metallic patterns provided between the pads, and coated with the solder resist, said dummy metallic patterns being grounded.

11. The semiconductor device according to claim 10, further comprising:

a stiffener adhered to a lower surface of said resin tape; and an adhesive provided between said resin tape and said stiffener, said adhesive having no bubbles.

* * * * *